(12) United States Patent
Sekiya et al.

(10) Patent No.: US 11,444,596 B2
(45) Date of Patent: Sep. 13, 2022

(54) ACOUSTIC WAVE DEVICE

(71) Applicant: Murata Manufacturing Co., Ltd., Nagaokakyo (JP)

(72) Inventors: Daisuke Sekiya, Nagaokakyo (JP); Yasuhiko Hirano, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1176 days.

(21) Appl. No.: 15/963,123

(22) Filed: Apr. 26, 2018

(65) Prior Publication Data

US 2018/0241370 A1    Aug. 23, 2018

Related U.S. Application Data

(63) Continuation of application No. PCT/JP2016/080816, filed on Oct. 18, 2016.

(30) Foreign Application Priority Data

Dec. 11, 2015    (JP) .............................. JP2015-242596

(51) Int. Cl.
| | |
|---|---|
| *H03H 9/02* | (2006.01) |
| *H03H 9/10* | (2006.01) |
| *H01L 41/047* | (2006.01) |
| *H03H 9/05* | (2006.01) |
| *H03H 9/25* | (2006.01) |
| *H01L 23/00* | (2006.01) |

(Continued)

(52) U.S. Cl.
CPC ......... *H03H 9/02897* (2013.01); *H01L 24/05* (2013.01); *H01L 24/13* (2013.01);
(Continued)

(58) Field of Classification Search
CPC ........... H03H 9/02897; H03H 9/02559; H03H 9/1092; H03H 9/145; H01L 41/0477
(Continued)

(56) References Cited

U.S. PATENT DOCUMENTS

| | | | |
|---|---|---|---|
| 6,251,704 B1 | 6/2001 | Ohuchi et al. | |
| 2008/0150134 A1* | 6/2008 | Shinkai | .................. H01L 24/13 |
| | | | 257/737 |

(Continued)

FOREIGN PATENT DOCUMENTS

| | | |
|---|---|---|
| JP | 11-191565 A | 7/1999 |
| JP | 2007-134635 A | 5/2007 |

(Continued)

OTHER PUBLICATIONS

Official Communication issued in corresponding Japanese Patent Application No. 2017-554960, dated Jul. 2, 2019.

(Continued)

*Primary Examiner* — Derek J Rosenau
(74) *Attorney, Agent, or Firm* — Keating & Bennett, LLP

(57) ABSTRACT

An acoustic wave device includes a piezoelectric substrate, an IDT electrode and an electrode pad provided on a front surface of the piezoelectric substrate, a support layer provided on the front surface so as to surround the IDT electrode, a first cover layer and a second cover layer provided on the support layer such that the first cover layer, the second cover layer, the support layer, and the piezoelectric substrate seal the IDT electrode in a hollow space, a UBM portion joined to the electrode pad, and a bump joined to the UBM portion. A joint surface of the UBM portion at which the UBM portion is joined to the bump has a spherical shape or substantially spherical shape that is convex towards the bump side.

17 Claims, 7 Drawing Sheets

(51) Int. Cl.
*H03H 9/145* (2006.01)
*H03H 9/64* (2006.01)

(52) U.S. Cl.
CPC ........ *H03H 9/02559* (2013.01); *H03H 9/059* (2013.01); *H03H 9/0576* (2013.01); *H03H 9/1071* (2013.01); *H03H 9/1092* (2013.01); *H03H 9/145* (2013.01); *H03H 9/25* (2013.01); *H03H 9/64* (2013.01); *H01L 41/0477* (2013.01); *H01L 2224/0401* (2013.01); *H01L 2224/05144* (2013.01); *H01L 2224/05147* (2013.01); *H01L 2224/05155* (2013.01); *H01L 2224/11* (2013.01); *H01L 2224/12105* (2013.01); *H01L 2224/13111* (2013.01); *H01L 2224/13139* (2013.01); *H01L 2224/13144* (2013.01); *H01L 2224/13147* (2013.01); *H01L 2924/3512* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 2008/0277771 A1* | 11/2008 | Higashi | H03H 9/1092 257/E23.188 |
| 2009/0051245 A1 | 2/2009 | Takayama et al. | |
| 2009/0160049 A1 | 6/2009 | Shinkai et al. | |
| 2010/0052473 A1* | 3/2010 | Kimura | H03H 9/059 29/25.35 |
| 2010/0225202 A1* | 9/2010 | Fukano | H03H 9/105 310/313 C |
| 2010/0289600 A1 | 11/2010 | Takada et al. | |
| 2010/0327694 A1 | 12/2010 | Omote et al. | |
| 2013/0140074 A1 | 6/2013 | Yang et al. | |

FOREIGN PATENT DOCUMENTS

| | | |
|---|---|---|
| JP | 2007-258438 A | 10/2007 |
| JP | 2008-041828 A | 2/2008 |
| JP | 2008-159948 A | 7/2008 |
| JP | 2008-159949 A | 7/2008 |
| JP | 2009-141036 A | 6/2009 |
| JP | 2011-029314 A | 2/2011 |
| JP | 2012-119928 A | 6/2012 |
| JP | 2013-118370 A | 6/2013 |
| JP | 2015-050615 A | 3/2015 |
| WO | 2006/106831 A1 | 10/2006 |
| WO | 2009/104438 A1 | 8/2009 |
| WO | 2009/116222 A1 | 9/2009 |

OTHER PUBLICATIONS

Official Communication issued in International Patent Application No. PCT/JP2016/080816, dated Jan. 10, 2017.

* cited by examiner

ACOUSTIC WAVE DEVICE

CROSS REFERENCE TO RELATED APPLICATIONS

This application claims the benefit of priority to Japanese Patent Application No. 2015-242596 filed on Dec. 11, 2015 and is a Continuation Application of PCT Application No. PCT/JP2016/080816 filed on Oct. 18, 2016. The entire contents of each application are hereby incorporated herein by reference.

BACKGROUND OF THE INVENTION

1. Field of the Invention

The present invention relates to an acoustic wave device to be flip-chip mounted.

2. Description of the Related Art

Examples of mounting techniques for reducing the size and height of an electronic device include flip-chip mounting.

FIG. 7 is a sectional view of an electronic device disclosed in International Publication No. 2009/104438. An acoustic wave device 500 illustrated in FIG. 7 includes a substrate 510, a vibrator 512, pads 513, a support layer 515, a cover layer 516, a protective layer 517, via conductors 521, and outer electrodes 520. The vibrator 512 includes an electrode 511 formed on one main surface 510a of the substrate 510. The pads 513 are electrically connected to the electrode 511. The support layer 515 is provided so as to surround the vibrator 512. The cover layer 516 is provided so as to cover the support layer 515 and the vibrator 512, so as to form a hollow space 514 around the vibrator 512. The cover layer 516 is a sheet that includes at least synthetic rubber and resin. The protective layer 517 is formed of a flux-resistant resin. The via conductors 521 penetrate through the protective layer 517, the cover layer 516, and the support layer 515 and are connected to the pads 513. Each of the outer electrodes 520 is provided at an end portion of a corresponding one of the via conductors 521 on the protective layer 517 side and formed by a solder bump. With this structure, flowing of flux into the hollow space 514 is suppressed while being mounted using the outer electrodes 520. Thus, the acoustic wave device having the highly liquid-tight hollow space 514 can be provided.

However, in the case of the acoustic wave device described in International Publication No. 2009/104438, when the acoustic wave device is mounted on an external mounting board or the like and is subjected to cycles of high-temperature and low-temperature, the acoustic wave device repeatedly expands and contracts, and joints of the acoustic wave device are subjected to thermal shocks. Thus, there is a problem in that, when the acoustic wave device has low thermal shock resistance, the joints of the acoustic wave device break. More specifically, when thermal shocks are repeatedly applied, cracks are caused in the solder bump. In particular, a portion of the solder bump at which the strength is lowest is near an interface between the solder bump (outer electrode 520) and the via conductor 521.

SUMMARY OF THE INVENTION

Preferred embodiments of the present invention provide flip-chip mounting acoustic wave devices having high thermal shock resistance.

An acoustic wave device according to a preferred embodiment of the present invention includes a piezoelectric substrate, a functional electrode, an electrode pad, a support, a cover, a via conductor, and a bump. The functional electrode is provided on a front surface of the piezoelectric substrate. The electrode pad is provided on the front surface of the piezoelectric substrate. The support is provided on the front surface of the piezoelectric substrate so as to surround the functional electrode. The cover is provided on the support such that the cover, the support, and the piezoelectric substrate seal the functional electrode in a hollow space. The via conductor is joined to the electrode pad. The bump is joined to the via conductor. A joint surface of the via conductor at which the via conductor is joined to the bump has a curved shape that is convex towards a bump side.

In an acoustic wave device that has a WLP (wafer level package) structure in which the piezoelectric substrate through which elastic waves are propagated defines and functions as a package and that includes the bump that provides mechanical and electrical connection to an external mounting board or other substrate, cracks may be caused near an interface between the bump and the via conductor due to thermal shocks. In contrast, with the above-described structure, the joint surface of the via conductor has the curved shape that is convex towards the bump side. Thus, compared to the case in which the shape of the joint surface is not convexly curved towards the bump side, extending distances of the cracks caused in the bump along a joint interface are increased. That is, thermal shock resistance is improved by increasing the crack extending distances required to cause an open failure in the bump. Accordingly, damage to the bump due to thermal shocks or other forces is able to be reduced or prevented. Thus, a WLP acoustic wave device having high thermal shock resistance is able to be provided.

Furthermore, the via conductor may penetrate through the cover and the support, and the bump may project from the cover.

Thus, the bump that connects to the external mounting board or other substrate is provided on the front surface side (cover side) of the piezoelectric substrate. With this structure, the joint surface of the via conductor has the curved shape that is convex towards the bump side. This increases the extending distances of the cracks caused in the bump, which has a lower mechanical strength than the via conductor, along the joint interface. Furthermore, when the joint surface of the via conductor has the curved shape, the contact area between the via conductor and the bump is able to be increased without changing the diameter of the via conductor. Accordingly, damage to the bump due to thermal shocks or other forces is able to be reduced or prevented. Thus, the acoustic wave device that has the WLP structure having high thermal shock resistance and that is small in size and height is able to be provided.

Furthermore, a convex portion of the joint surface of the via conductor at which the via conductor is joined to the bump may project from the cover.

With this structure, the joint surface of the via conductor at which the via conductor is joined to the bump is not limited by the size of a via opening of the cover. Accordingly, the contact area between the via conductor and the bump is able to be increased. This allows the extending distances of the cracks caused in the bump along the joint interface to be further increased. That is, since the extending distances of the cracks are able to be determined in accordance with the size of the bump independently of the diameter of the via opening of the cover, thermal shock resistance is further improved.

Furthermore, the via conductor may be provided in the piezoelectric substrate so as to penetrate through the piezoelectric substrate, and the bump may project from a rear surface of the piezoelectric substrate.

Thus, the bump that connects to the external mounting board or other substrate is provided on the rear surface side of the piezoelectric substrate. With this structure, heat release performance of the hollow space in which elastic waves propagate is greatly improved. Furthermore, the joint surface of the via conductor has the curved shape that is convex towards the bump side. This increases the extending distances of the cracks caused in the bump, which has a lower mechanical strength than the via conductor, along the joint interface. Furthermore, when the joint surface of the via conductor has the curved shape, the contact area between the via conductor and the bump is able to be increased without changing the diameter of the via conductor. Accordingly, damage to the bump due to thermal shocks or other forces is able to be reduced. Thus, the acoustic wave device that has the WLP structure having high thermal shock resistance and that is small in size and height is able to be provided.

Furthermore, a convex portion of the joint surface of the via conductor at which the via conductor is joined to the bump may project to a level below a level of the piezoelectric substrate.

With this structure, the joint surface of the via conductor at which the via conductor is joined to the bump is not limited by the size of a via opening of the rear surface of the piezoelectric substrate. Accordingly, the contact area between the via conductor and the bump is able to be increased. This allows the extending distances of the cracks caused in the bump along the joint interface to be further increased. That is, since the extending distances of the cracks is able to be determined in accordance with the size of the bump independently of the diameter of the via opening of the rear surface of the piezoelectric substrate, thermal shock resistance is further improved.

Furthermore, a sectional area of the via conductor in a plane direction of the piezoelectric substrate may increase from a joint surface at which the via conductor is joined to the electrode pad towards the joint surface at which the via conductor is joined to the bump except for a convex portion of the joint surface at which the via conductor is joined to the bump.

It is assumed that the via conductor having the above-described shape is formed by, for example, a plating method in which metal is isotropically grown. In this case, a via in which the via conductor is disposed has a tapered shape having a sectional area that increases from the electrode pad side towards the bump side. Thus, the shape of the convex portion of the via conductor has the curvature in accordance with a taper angle. Accordingly, the joint surface of the via conductor at which the via conductor is joined to the bump is able to have a spherical shape or substantially spherical shape that is convex towards the bump side.

Furthermore, an acoustic wave device according to a preferred embodiment of the present invention includes a piezoelectric substrate, a functional electrode, a mounting substrate, an electrode, a bump, and a sealing member. The functional electrode is provided on a front surface of the piezoelectric substrate and converts an elastic wave propagating through the piezoelectric substrate into an electric signal or converts an electric signal into the elastic wave. The piezoelectric substrate is mounted on the mounting substrate. The electrode is provided on the front surface of the piezoelectric substrate or a main surface of the mounting substrate and extracts the electric signal from the functional electrode or supplies an electric signal to the functional electrode. The bump is joined to the electrode. The sealing member seals the piezoelectric substrate to the mounting substrate. A joint surface of the electrode at which the electrode is joined to the bump has a curved shape that is convex towards a bump side.

Thus, the acoustic wave device preferably has a CSP (chip sized package) structure in which the hollow space in which the elastic wave propagates is sealed by the sealing member. In this structure, the joint surface of the via electrode has the curved shape that is convex towards the bump side. This increases the extending distances of the cracks caused in the bump along the joint interface. Accordingly, the acoustic wave device that has the CSP structure having high thermal shock resistance is able to be provided.

According to preferred embodiments of the present invention, the extending distances of the cracks caused in the bump along the joint interface are increased. This improves thermal shock resistance. Accordingly, damage to the bump due to thermal shocks is able to be reduced or prevented. Thus, acoustic wave devices having high thermal shock resistance are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
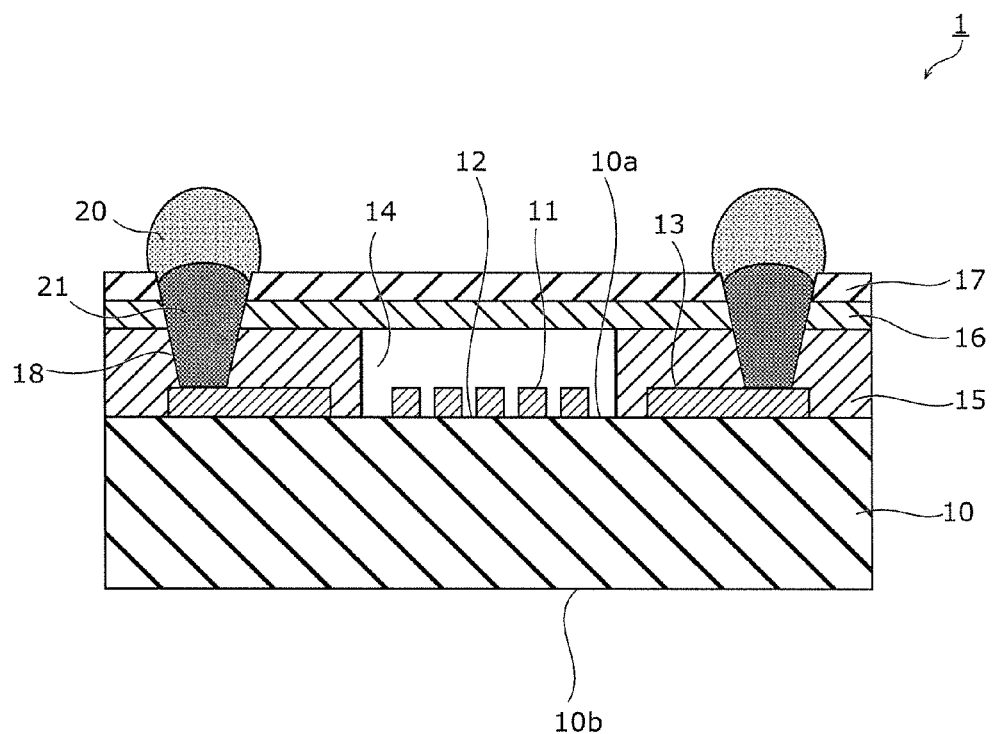
FIG. 1 is a sectional view of an acoustic wave device according to a first preferred embodiment of the present invention.

Preferred embodiments of the present invention will be described in detail below with reference to the drawings. The preferred embodiments described below represent comprehensive or specific examples. Values, shapes, materials, elements, arrangement, and connecting configurations of the elements, production steps, the order of the production steps, and so forth described in the following preferred embodiments are examples and are not intended to limit the present invention. Out of the elements to be described in the preferred embodiments, elements not described in the independent claims are described as arbitrary elements. Furthermore, the sizes of the elements or the ratios of the sizes of the elements illustrated in the drawings are not necessarily exact.

First Preferred Embodiment

FIG. 1 is a sectional view of an acoustic wave device according to a first preferred embodiment of the present invention. The acoustic wave device 1 illustrated in FIG. 1 includes a piezoelectric substrate 10, a vibrator 12, electrode pads 13, a support layer 15, a first cover layer 16, a second cover layer 17, under bump metal portions (referred to as "UBM portions" hereafter) 21, and bumps 20. The acoustic wave device 1 according to the present preferred embodiment preferably has a WLP (Wafer Level Package) structure in which the piezoelectric substrate 10 through which elastic waves propagate, defines and functions as a package. Thus, the size and the height of the acoustic wave device 1 are reduced. Such an acoustic wave device 1 is preferably used for, for example, a surface acoustic wave (SAW) filter that selectively allows a high-frequency signal of a specified band width to pass therethrough.

The vibrator 12 includes an IDT (Interdigital Transducer) electrode 11 provided on a front surface 10a of the piezoelectric substrate 10. The IDT electrode 11 is a functional electrode that converts elastic waves propagating through the piezoelectric substrate 10 into electric signals or converts the electric signals into the elastic waves. The electrode pads 13 are provided on the front surface 10a of the piezoelectric substrate 10 such that the electrode pads 13 are connected to the IDT electrode 11. The electrode pads 13 extract the electric signals converted by the IDT electrode 11 or supply the electric signals to the IDT electrode 11.

The piezoelectric substrate 10 is preferably made of, for example, a $LiNbO_3$ single crystal or a $LiTaO_3$ single crystal. The IDT electrode 11 is preferably a comb-shaped electrode primarily made of, for example, Cu, Al, Pt, a multilayer body of Cu, Al, or Pt, or an alloy of Cu, Al, or Pt.

The support layer 15 surrounds the IDT electrode 11. The first cover layer 16 is provided on the support layer 15, and the second cover layer 17 is provided on the first cover layer 16. The first cover layer 16 and the second cover layer 17 are included in a cover. The cover does not necessarily include two layers, that is, the first cover layer 16 and the second cover layer 17. The cover may include only the first cover layer 16.

With the above-described structure, the IDT electrode 11 is sealed in a hollow space 14 by the piezoelectric substrate 10, the support layer 15, the first cover layer 16, and the second cover layer 17.

The support layer 15 is preferably made of, for example, a material that includes at least one of polyimide, epoxy, benzocyclobutene (BCB), polybenzoxazole (PBO), metal, and silicon oxide.

The first cover layer 16 is preferably made of, for example, a material that includes at least one of epoxy, urethane, phenol, polyester, BCB, and PBO.

The second cover layer 17 is preferably made of, for example, a material that includes at least one of polyimide, epoxy, BCB, PBO, silicon, silicon oxide, $LiTaO_3$ and $LiNbO_3$.

The via holes (through holes) 18 that extend to the electrode pads 13 provided on the front surface 10a of the piezoelectric substrate 10 are provided in the first cover layer 16, the second cover layer 17, and the support layer 15. The via holes 18 are filled with the UBM portions 21 that define via conductors. Each of the UBM portions 21 is a first electrode joined to a corresponding one of the electrode pads 13. The UBM portions 21 penetrate through the first cover layer 16, the second cover layer 17, and the support layer 15 and are provided above the piezoelectric substrate 10. The bumps 20 exposed to the outside are provided on the UBM portions 21. Preferred examples of the material of the UBM portions 21 include Cu/Ni alloy, Ni/Au alloy, and other suitable materials filled into the via holes 18 by, for example, electrolytic plating. Au films may be provided on the surfaces of the UBM portions 21 to reduce or prevent oxidation.

The bumps 20 are outer connection electrodes joined to surfaces of the UBM portions 21 not joined to the electrode pads 13. The bumps 20 project from the second cover layer 17. The bumps 20 are preferably ball-shaped electrodes made of highly conductive metal. Examples of the bumps 20 include, for example, solder bumps made of Sn/Ag/Cu, bumps primarily made of Au, and other suitable materials.

Here, joint surfaces of the UBM portions 21 at which the UBM portions 21 are joined to the respective bumps 20 have a curved shape that is convex towards the bump 20 side. In particular, according to the present preferred embodiment, the joint surfaces of the UBM portions 21 at which the UBM portions 21 are joined to the respective bumps 20 preferably have a spherical shape or substantially spherical shape that is convex towards the bump 20 side.

Examples of the curved shape include a surface shape of a polyhedron defined by connecting a plurality of flat planes.

The material of the UMB portions 21 and the material of the bumps 20 are preferably different from each other and have different linear expansion coefficients from each other. Due to the differences in linear expansion coefficient, edges of joint surfaces of the UBM portions 21 at which the UBM portions 21 are joined to the respective bumps 20 is likely to expand and break or crack. To prevent such breakage and/or cracking, for example, the second cover layer is preferably in contact with the edges of the joint surfaces of the UBM portions 21 at which the UBM portions 21 are joined to the respective bumps 20.

Furthermore, FIG. 1 illustrates only two sets of electrodes with the hollow space 14 interposed therebetween. Each of the sets of electrodes includes one of the via holes 18, one of the UBM portions 21, and one of the bumps 20. However, the number of electrodes to be disposed corresponds to the numbers of input-output terminals and GND terminals of the acoustic wave device 1, a balance of strength with which the electrodes are joined to an external mounting board, and other relevant factors. The acoustic wave device 1 is mechanically and electrically flip-chip mounted on the external mounting board by arranging the plurality of electrodes to face land electrodes of the external mounting board and applying ultrasonic waves, heat, or a combination of these to the bumps 20.

Figure 2A:
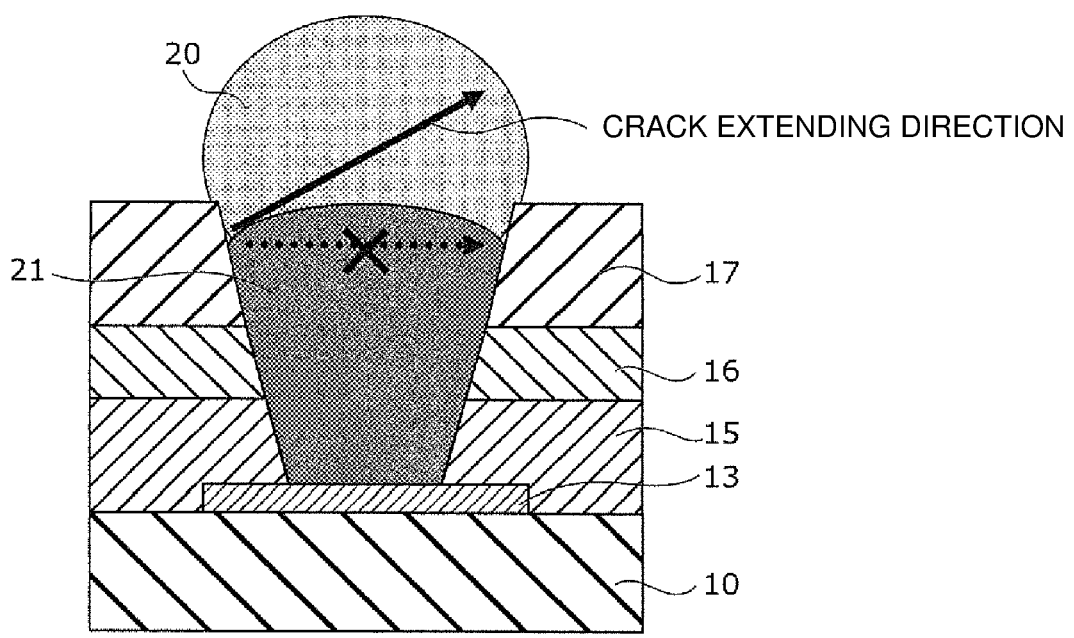
FIG. 2A is a sectional view of a region near a bump of the acoustic wave device according to the first preferred embodiment of the present invention.
Figure 2B:
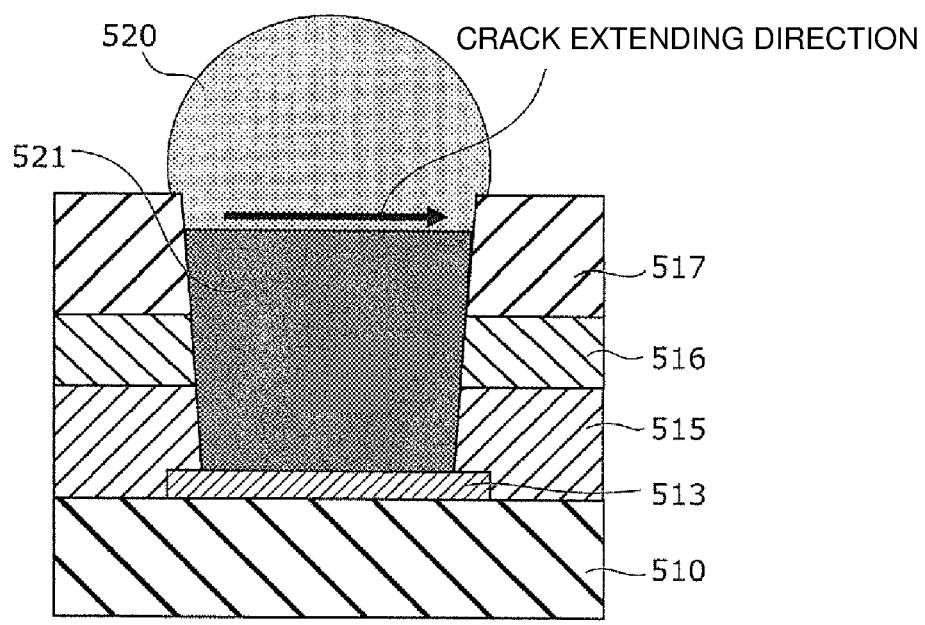
FIG. 2B is a sectional view of a region near a bump of an acoustic wave device according to a comparative example.

FIG. 2A is a sectional view of a region near the bump of the acoustic wave device 1 according to the first preferred embodiment. FIG. 2B is a sectional view of a region near the bump of an acoustic wave device 500 according to a comparative example. As illustrated in FIG. 2A, in the acoustic wave device according to the present preferred embodiment, the joint surfaces of the UBM portions 21 at which the UBM portions 21 are joined to the respective bumps 20 have a spherical shape or substantially spherical shape that is convex towards the bump 20 side. In contrast, as illustrated in FIG. 2B, in the acoustic wave device 500 according to the comparative example, joint surfaces of the UBM portions 521 where the UMB portions 521 are joined to the respective bumps 520 have a flat shape.

In an acoustic wave device that has the WLP structure and includes bumps that mechanically and electrically connect to an external mounting board, stress is applied between the bumps and UBM portions when thermal shock testing is performed. This may cause cracks starting from a region near joint surfaces between the bumps and the UBM portions. Furthermore, the cracks are selectively caused in the bumps, which have a lower mechanical strength than the UBM portions, rather than in the joint surfaces themselves.

In the case of the acoustic wave device 500 according to the comparative example, since the joint surface of each of the UBM portions 521 have a flat shape, the cracks extend in a corresponding one of the bumps 520 in straight directions (horizontal directions in FIG. 2B) along the joint interface as illustrated in FIG. 2B.

In contrast, in the case of the acoustic wave device according to the present preferred embodiment, the joint surface of each of the UBM portions 21 has the spherical shape that is convex towards the bump 20 side. Thus, the directions in which the cracks caused near the joint interface in the corresponding one of the bumps 20 extend are not horizontal. This reduces or prevents cracks from occurring. Even when the cracks do occur, as illustrated in FIG. 2A, the cracks extend, for example, in directions along the joint surface or directions toward the center of the bump 20 starting from the joint interface at an outer periphery of the bump 20. This produces long extending distances of the cracks as compared to the case of the acoustic wave device 500. Since the cracks tend to extend as the number of cycles of thermal shocks increases, the number of cycles of the thermal shocks during which a normal state is maintained is able to increased, and accordingly, thermal shock resistance is improved by increasing the crack extending distances required to cause the cracks to completely extend across the bump so as to cause an open failure.

Furthermore, in the case of the acoustic wave device 500 according to the comparative example, the diameter of the via conductor 521 is increased as one of measures for improving the thermal shock resistance. However, when the diameter of the via conductor 521 is increased, the size of a bump pad is increased. This causes a problem in that freedom of design of a flip-chip type having a small size and a small height is degraded.

In contrast, in the case of the acoustic wave device according to the present preferred embodiment, the joint surface of the UBM portion 21 has the above-described curved shape. This allows the contact area between the UBM portion 21 and the bump 20 to be increased without changing the diameter of the via in which under bump metal portion is provided. Accordingly, damage to the bump due to thermal shocks or other forces is able to be reduced. Thus, the WLP acoustic wave device 1 having high thermal shock resistance is able to be provided.

Although the joint surface of the UBM portion 21 at which the UBM portion 21 is joined to the bump 20 preferably has a spherical shape or substantially spherical shape that is convex towards the bump 20 side according to the present preferred embodiment, this is not limiting. The joint surface of the UBM portion 21 at which the UBM portion 21 is joined to the bump 20 may have any curved shape that is convex towards the bump 20 side. Thus, the extending directions of cracks caused in the joint interface in the bump 20 are not horizontal as illustrated in FIG. 2B. Accordingly, compared to the acoustic wave device 500, long extending distances are able to be ensured.

Figure 3:
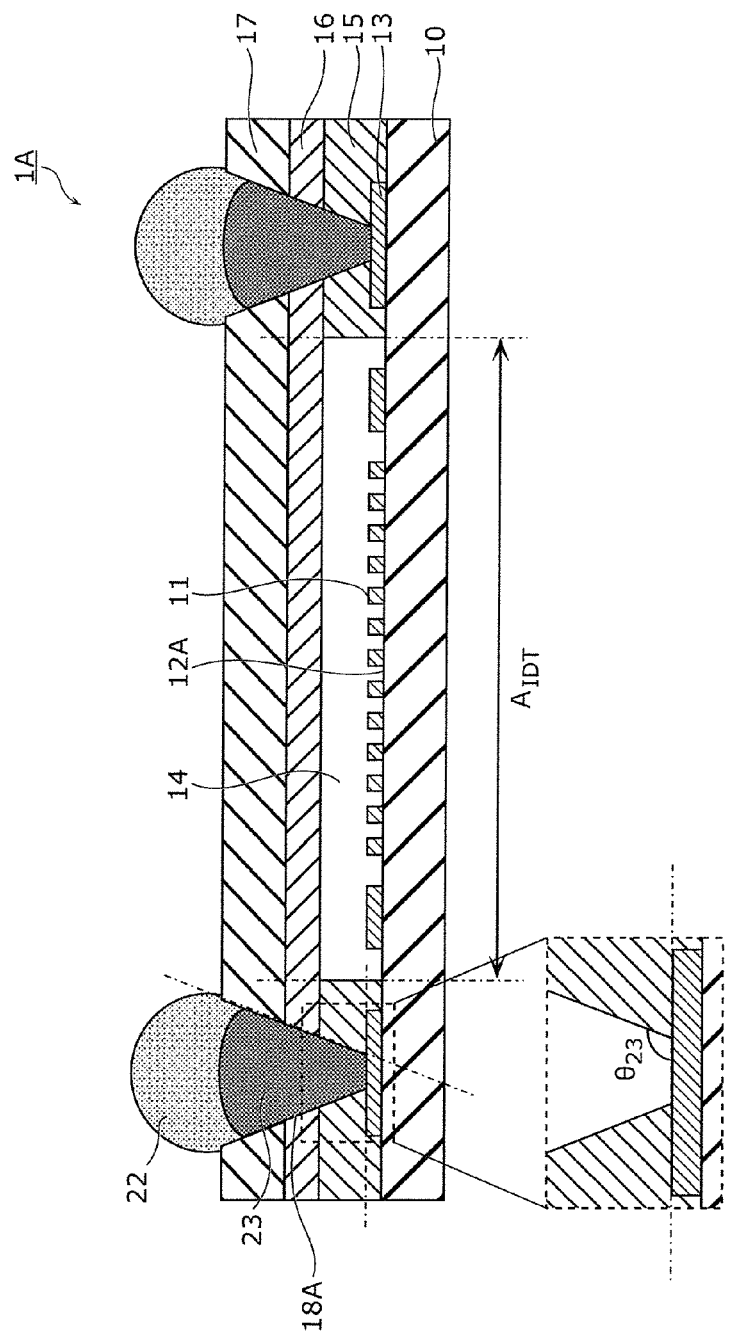
FIG. 3 is a sectional view of an acoustic wave device according to a first variation of the first preferred embodiment of the present invention.

FIG. 3 is a sectional view of an acoustic wave device 1A according to a first variation of the first preferred embodiment. The acoustic wave device 1A illustrated in FIG. 3 includes the piezoelectric substrate 10, a vibrator 12A, the electrode pads 13, the support layer 15, the first cover layer 16, the second cover layer 17, UBM portions 23, and bumps 22. The acoustic wave device 1A illustrated in FIG. 3 includes via holes 18A, into which the UBM portions 23 are filled, having a different shape as compared to that of the acoustic wave device 1 according to the first preferred embodiment. The acoustic wave device 1A according to the first variation will be described below by focusing on different elements from those of the acoustic wave device 1 and omitting description of the same elements as those of the acoustic wave device 1.

The via holes 18A that extend to the electrode pads provided on the front surface 10a of the piezoelectric substrate 10 are provided in the first cover layer 16, the second cover layer 17, and the support layer 15. The via holes 18A are filled with the UBM portions 23 that define via conductors. The bumps 22 exposed to the outside are provided on the UBM portions 23.

Here, the shape of a side wall surface of each of the via holes 18A is preferably a conical shape (tapered shape), the size of which increases from a corresponding one of the electrode pads 13 to a corresponding one of the bumps 22. That is, as illustrated in FIG. 3, a taper angle 023 between the side wall surface of the via hole 18A and an upper surface of the electrode pad 13 is preferably larger than about 90 degrees, for example. In accordance with this, the sectional area of a corresponding one the UBM portions 23, which is filled into the via hole 18A, in a plane direction of the piezoelectric substrate 10 increases from the joint surface at which the UBM portion 23 is joined to the electrode pad 13 towards the joint surface at which the UBM portion 23 is joined to the bump 22, except for a convex portion of the joint surface joined to the bump 22.

When the UBM portion 23 is formed in the via hole 18A by, for example, a plating method including isotropically growing metal, the joint surface of the UBM portion becomes flat in the case in which the side wall of the via hole is vertical. In contrast, according to the present variation of the first preferred embodiment, the side wall surface of the via hole 18A has a tapered shape as described above. Thus, the shape of the convex portion of the UBM portion 23 has a curvature in accordance with the taper angle $\theta_{23}$. More specifically, as the taper angle $\theta_{23}$ increases, the curvature of the shape of the convex portion increases. With the tapered shape of the via hole 18A and the UBM portion 23, the shape of the joint surface of the UBM portion 23 at which the UBM portion 23 is joined to the bump 22 is able to be a spherical shape having a larger curvature. Accordingly, the extending distances of the cracks in the bump 22 caused due to thermal shocks or other forces are able to be further increased, and the joint area between the UBM portion 23 and the bump 22 is able to be increased. Thus, thermal shock resistance is improved. Accordingly, damage to the bump due to thermal shocks or other forces is able to be reduced. Thus, the WLP acoustic wave device 1A having high thermal shock resistance is able to be provided.

Furthermore, the via hole 18A and the UBM portion 23 preferably have a conical shape (tapered shape) the size of which reduces from the bump 22 toward the electrode pad 13. Accordingly, the area of the electrode pad 13 for a required size of the bump is able to be reduced. Accordingly, it is ensured that the area of the vibrator 12A ($A_{IDT}$) provided between the plurality of electrode pads 13 is large. This improves freedom of design of the arrangement of, for example, the IDT electrode 11.

Figure 4:
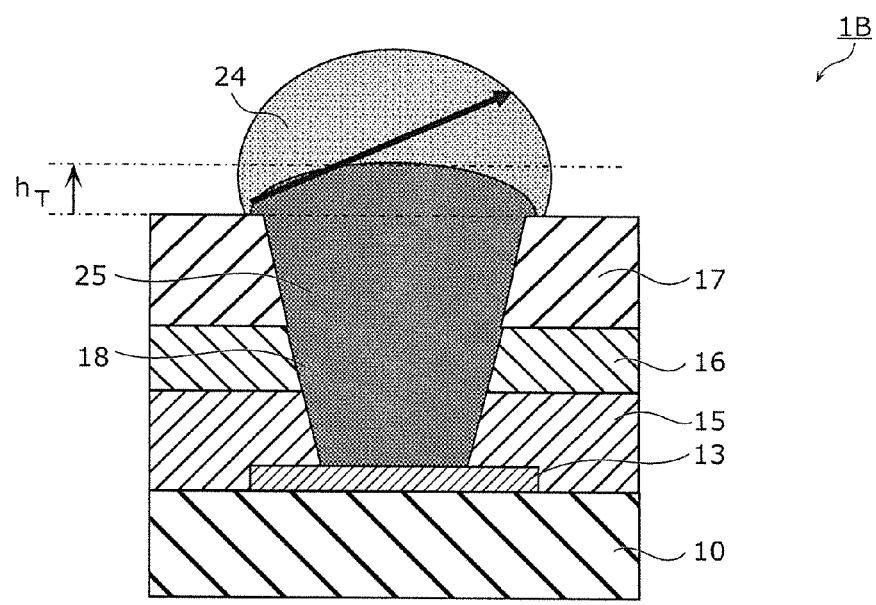
FIG. 4 is a sectional view of a region near a bump of an acoustic wave device according to a second variation of the first preferred embodiment of the present invention.

FIG. 4 is a sectional view of a region near a bump of an acoustic wave device 1B according to a second variation of the first preferred embodiment. The acoustic wave device 1B includes the piezoelectric substrate 10, the vibrator 12A, the electrode pads 13, the support layer 15, the first cover layer 16, the second cover layer 17, UBM portions 25, and bumps 24. In the acoustic wave device 1B according to the present variation, the level of the joint surface between each of the UBM portions 25 and a corresponding one of the bumps 24 relative to the cover is different from that of the acoustic wave device 1 according to the first preferred embodiment. The acoustic wave device 1B according to the second variation will be described below by focusing on different elements from those of the acoustic wave device 1 and omitting description of the same elements as those of the acoustic wave device 1.

The via holes 18 are filled with the UBM portions 25 that define the via conductors. The bumps 24 exposed to the outside are provided on the UBM portions 25. Here, a convex portion of the joint surface of each of the UBM portions 25 at which the UBM portion 25 is joined to a corresponding one of the bumps 24 projects to a level above a level of the second cover layer 17. As illustrated in FIG. 4, the convex portion of the joint surface of the UBM portion 25 at which the UBM portion 25 is joined to the bump 24 projects to a higher level than the level of an upper surface of the second cover layer 17 by $h_T$.

With this structure, the joint surface of the UBM portion 25 at which the UBM portion 25 is joined to the bump 24 is not restricted by the size of an opening of the via hole 18. Accordingly, the joint area between the UBM portion 25 and the bump 24 is able to be increased to an area larger than the opening. This allows the extending distances of the cracks caused in the bump 24 along the joint interface to be further increased. That is, since the extending distances of the cracks is able to be determined in accordance with a required size of the bump independently of the diameter of the via opening of the cover, thermal shock resistance is improved. Accordingly, damage to the bump due to thermal shocks or other force is able to be reduced. Thus, the acoustic wave device 1B having high thermal shock resistance is able to be provided.

Here, the acoustic wave device 1B according to the second variation of the first preferred embodiment and the acoustic wave device 500 according to the comparative example were fabricated and thermal shock resistance thereof was evaluated. The fabrication and results of the evaluation are described as follows.

First, production steps of the acoustic wave device 1B having the WLP structure are described.

A conductive pattern including the IDT electrode 11 and the electrode pads 13 was formed on the front surface 10a of the piezoelectric substrate 10. Then, the support layer 15 was formed around the vibrator 12. A photosensitive polyimide-based resin was applied to the entirety of the front surface 10a. Then, a cavity was formed in a region around the vibrator (region around the vibrator 12 was removed) in the support layer 15 by photolithography.

A sheet shaped composite material in which a sheet material that becomes the first cover layer 16 and a sheet material that becomes the second cover layer 17 had been laminated in advance was provided on the support layer 15 by laminating, thus the first cover layer 16 and the second cover layer 17 were simultaneously formed. A non-photosensitive epoxy-based film for which a low-temperature solidifying process may be used was used for the first cover layer 16. Furthermore, a polyimide-based resin was used for the second cover layer 17.

Next, the via holes 18 which penetrate through the second cover layer 17, the first cover layer 16, and the support layer 15 and in which the electrode pads 13 are exposed at bottom portions were formed by laser beam machining. Then, as the via conductors filled into the via holes 18, the UBM portions 25 were formed by Cu/Ni electrolytic plating, and Au preferably having a thickness of about 0.05 μm to about 0.1 μm, for example, was formed on the surfaces of the UBM portions 25 to prevent oxidation.

Next, solder paste such as Sn/Ag/Cu, for example, was applied directly on the UBM portions 25 through a metal mask. Then, the solder paste was heated at about 260° C. at which the solder paste melts so that the solder firmly adheres to the UBM portions 25, and flux was removed by using a flux cleaning agent. Thus, the bumps 24 having a spherical shape were formed. After that, a chip was cut out by, for example, dicing, thus the acoustic wave device 1B preferably having a size of about 1.2 mm×about 1.6 mm×about 0.12 mm, for example, was fabricated. Preferably, the height of the support layer 15 was about 14 μm, the height of the first cover layer 16 was about 12.5 μm, and the height of the second cover layer 17 was about 17.5 μm, for example.

The acoustic wave device 500 according to the comparative example was also fabricated in steps that were similar to the production steps of the acoustic wave device 1B.

However, the following measures were taken for the production steps of the acoustic wave device 1B according to the second variation. That is, in the step of forming the via holes 18, the conditions for the laser beam machining were optimized, such that the side wall surface of each of the via holes 18 had a tapered shape (represented as "High taper" in Table 1) the size of which increases from the electrode pad 13 towards the bump 24. Furthermore, the amount of Cu/Ni to be filled was optimized in the step of forming each of the UBM portions 25 in a corresponding one of the via hole 18, thus the UBM portion 25 was formed such that the convex portion of the joint surface of the UBM portion 25 at which the UBM portion 25 is joined to the bump 24 projects to a higher level than the level of the upper surface of the second cover layer 17 by $h_T$. In the present example, $h_T$=10 μm (represented as "+10" in Table 1). In contrast, in the acoustic wave device 500 according to the comparative example, the UBM portion was formed such that an uppermost portion of the joint surface of the UBM portion at which the UBM portion is joined to the bump is at a lower level than the upper surface of the second cover layer 17 by about 10 μm ($h_T$=−10 μm; represented as "−10" in Table 1).

The results of thermal shock testing performed on the acoustic wave device 1B and the acoustic wave device 500 produced in the above-described production steps are listed in Table 1.

TABLE 1

| | Mounting board | diameter of land in mounting board (μm) | Via shape | Bump height (μm) | UBM height (μm) | Thermal shock testing | | |
|---|---|---|---|---|---|---|---|---|
| | | | | | | 465 cyc | 600 cyc | 800 cyc |
| Example | PCB | 110 | High taper | 50 | +10 | ○ | ○ | ○ |
| Acoustic wave device 1B | LTCC | 125 | High taper | 50 | +10 | ○ | ○ | ○ |
| Comparative example | PCB | 110 | Standard | 50 | −10 | x | x | x |
| Acoustic wave device 500 | LTCC | 125 | Standard | 50 | −10 | x | x | x |

Table 1 illustrates the results when the acoustic wave devices according to the second variation of the first preferred embodiment and according to the comparative example are mounted on two types of boards, that is, a PCB board and a LTCC board defining mounting boards. According to the conditions of the thermal shock testing, a single cycle includes a sudden transition from about −40° C. for about 30 minutes to about 125° C. for about 30 minutes and a transition reverse to this. Regarding determination of OK ("○" in Table 1) or NG ("x" in Table 1), changes in resistance of the bump and the UBM portion after the start of the thermal cycles are measured, and the changes smaller than or equal to about ±1.0Ω are determined to be OK. Furthermore, a population parameter in the testing is about 30 for each.

As can be seen from Table 1, in the case of the acoustic wave device 500 according to the comparative example, there were NG devices on any type of the mounting boards as early as when 465 cycles of thermal shocks were applied. In contrast, in the case of the acoustic wave device 1B according to the example, there were no NG devices on any type of the mounting boards even after being subjected to 800 cycles of thermal shocks.

Compared to the above-described comparative example, the acoustic wave device 1B according to the second variation of the first preferred embodiment has improved thermal shock resistance. This improvement is achieved by enabling the extending distances of the cracks caused in the bump 24 along the joint interface to be further increased and allowing the extending distances of the cracks to be determined in accordance with a required size of the bump independently of the diameter of the via opening of the cover. That is, it is understood that, according to the second variation of the first preferred embodiment, damage to the bump due to thermal shocks or other forces is able to be reduced or prevented, and accordingly, the acoustic wave device 1B having high thermal shock resistance is able to be provided.

Second Preferred Embodiment

Although an acoustic wave device 2 according to a second preferred embodiment of the present invention has the WLP structure similar to the acoustic wave device according to the first preferred embodiment, the bumps are provided on the rear surface side of the piezoelectric substrate, instead of on the front surface side of the piezoelectric substrate 10 on which the IDT electrode 11 is provided.

Figure 5:
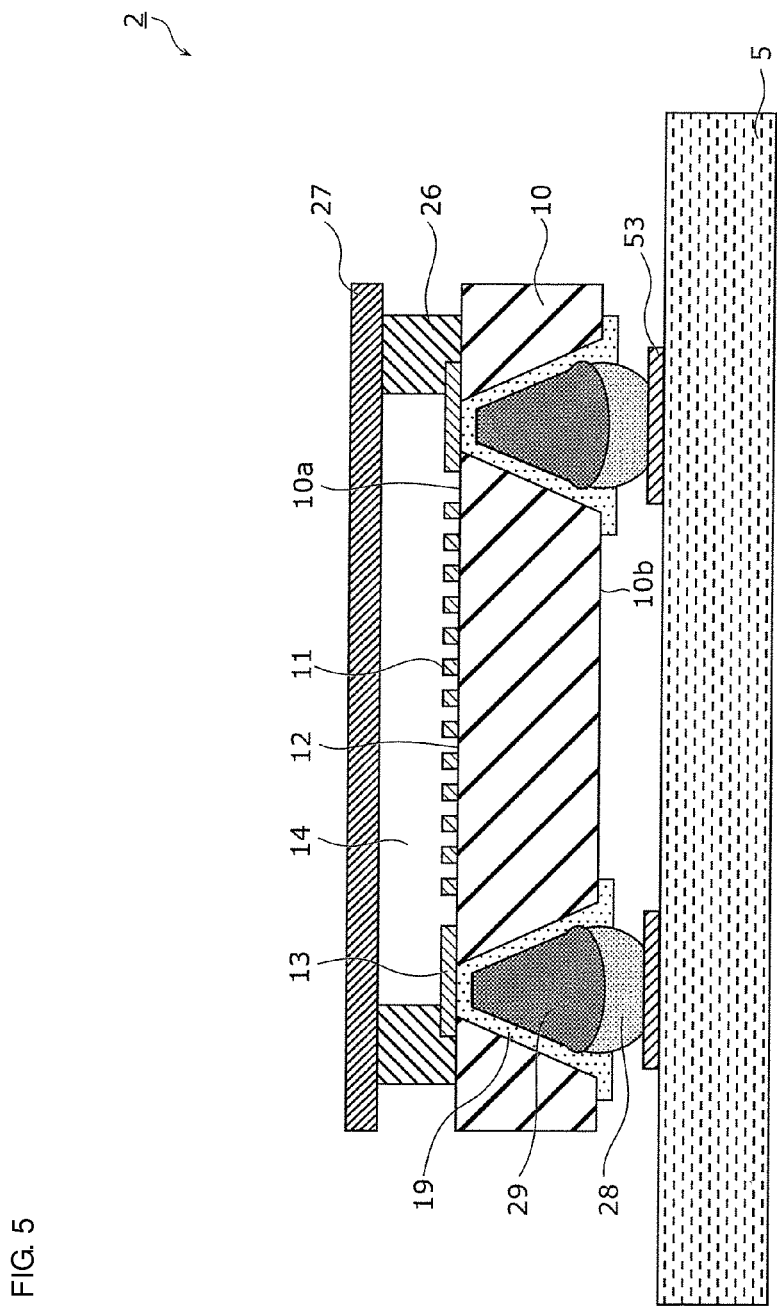
FIG. 5 is a sectional view of an acoustic wave device according to a second preferred embodiment of the present invention.

FIG. 5 is a sectional view of the acoustic wave device 2 according to the second preferred embodiment. The acoustic wave device 2 illustrated in FIG. 5 includes the piezoelectric substrate 10, the vibrator 12, the electrode pads 13, a support layer 26, a cover layer 27, UBM portions 29, and bumps 28. The acoustic wave device 2 according to the present preferred embodiment has the WLP structure in which the piezoelectric substrate 10 through which elastic waves propagate, defines and functions as a package. Thus, the size and the height of the acoustic wave device 1 are reduced. Such an acoustic wave device 2 is preferably used for, for example, a SAW filter. FIG. 5 illustrates a configuration in which the acoustic wave device 2 is mounted on an external mounting board 5 through the bumps 28. The acoustic wave device 2 according to the present preferred embodiment will be described below by focusing on different elements from those of the acoustic wave device 1 according to the first preferred embodiment, and the same elements as those of the acoustic wave device 1 according to the first preferred embodiment are denoted by the same reference signs, and the description thereof is omitted.

The support layer 26 surrounds the IDT electrode 11. The cover layer 27 is a cover provided on the support layer 26. The cover layer 27 may preferably include a plurality of layers as is the case with the first preferred embodiment.

With the above-described structure, the IDT electrode is sealed in the hollow space 14 by the piezoelectric substrate 10, the support layer 26, and second cover layer 27.

Via holes 19 that extend to the electrode pads 13 are provided in the piezoelectric substrate 10. The via holes 19 are filled with the UBM portions 29 that define the via conductors. Each of the UBM portions 29 is a via conductor joined to a corresponding one of the electrode pads 13. The UBM portions 29 are provided in the piezoelectric substrate 10 so as to penetrate through the piezoelectric substrate 10. The bumps 28 exposed to the outside are provided on the UBM portions 29. Preferred examples of the material of the UBM portions 29 include Cu/Ni alloy, Ni/Au alloy, and other suitable materials filled into the via holes 19 by, for example, electrolytic plating. Au films may be provided on the surfaces of the UBM portions 29 to reduce or prevent oxidation. Furthermore, as illustrated in FIG. 5, metal films may be provided on inner walls of the via holes 19 and lower surfaces of the electrode pads 13 in advance.

The bumps 28 are outer connection electrodes joined to surfaces of the UBM portions 29 not joined to the electrode pads 13. The bumps 28 project from the piezoelectric substrate 10. Here, joint surfaces of the UBM portions 29 at which the UBM portions 29 are joined to the respective bumps 28 have a curved shape that is convex towards the bump 28 side. In particular, according to the present preferred embodiment, the joint surfaces of the UBM portions 29 at which the UBM portions 29 are joined to the bumps 28 preferably have a spherical shape or substantially spherical shape that is convex towards the bump 28 side. The bumps 28 are ball-shaped electrodes preferably made of highly conductive metal. Examples of the bumps 28 include, for example, solder bumps made of Sn/Ag/Cu, bumps primarily made of Au, and other suitable bumps.

FIG. 5 illustrates only two sets of electrodes with the hollow space 14 interposed therebetween. Each of the sets of electrodes includes one of the via holes 19, one of the UBM portions 29, and one of the bumps 28. However, the number of electrodes to be disposed corresponds to the numbers of input-output terminals and GND terminals of the acoustic wave device 2, a balance of strength with which the electrodes are joined to the external mounting board 5, and other factors. The acoustic wave device 2 is mechanically and electrically flip-chip mounted on the external mounting board 5 by arranging the plurality of electrodes to face land electrodes 53 of the external mounting board 5 and applying ultrasonic waves, heat, or a combination of these to the bumps 28.

With the above-described structure, the joint surface of each of the UBM portions 29 preferably has the spherical shape or substantially spherical shape that is convex towards the bump 28 side. Thus, the directions in which the cracks caused near the joint interface in the corresponding one of the bumps 28 extend are not horizontal. The cracks extend, for example, in directions along the joint interface or directions toward the center of the bump 28 starting from the joint interface at an outer periphery of the bump 28. This ensures long extending distances of the cracks as compared to the related-art acoustic wave device in which the joint interface is flat. That is, since the cracks extend as the number of cycles of thermal shocks increases, thermal shock resistance is improved by increasing the crack extending distances required to cause the cracks to completely extend across the bump so as to cause an open failure. Accordingly, damage to the bump due to thermal shocks or other forces is able to be reduced. Thus, the WLP acoustic wave device 2 having high thermal shock resistance is able to be provided.

According to the present preferred embodiment, the joint surface of the UBM portion 29 at which the UBM portion 29 is joined to the bump 28 may have any curved shape that is convex towards the bump 28 side. Thus, the extending directions of the cracks caused in the joint interface in the bump 28 are not horizontal. Accordingly, as compared to the related-art acoustic wave device, long extending distances are ensured. When the joint surface of the UBM portion 29 has the above-described curved shape, the contact area between the UBM portion 29 and the bump 28 are able to be increased without changing the diameter of the via hole 19 in which the UBM portion 29 is provided. Accordingly, damage to the bump due to thermal shocks or other forces is able to be reduced. Thus, the acoustic wave device that has the WLP structure having high thermal shock resistance and that is small in size and height is able to be provided. Furthermore, in the WLP structure according to the present preferred embodiment, the bump 28 that connects to the external mounting board 5 is provided on the rear surface side of the piezoelectric substrate 10. With this structure, heat release performance of the hollow space 14 in which elastic waves propagate is preferable.

Furthermore, it is preferable that the sectional area of the UBM portion 29 in the plane direction of the piezoelectric substrate 10 increases from the joint surface at which the UBM portion 29 is joined to the electrode pad 13 towards the joint surface at which the UBM portion 29 is joined to the bump 28 except for a convex portion of the joint surface of the UBM portion 29 at which the UBM portion 29 is joined to the bump 28. That is, it is preferable that the shape of a side wall surface of the via hole 19 be a conical shape (tapered shape) the size of which increases from the electrode pad 13 toward the bump 28. With this configuration, the shape of the joint surface of the UBM portion 29 at which the UBM portion 29 is joined to the bump 28 is able to be a spherical shape or substantially spherical shape having a large curvature. Accordingly, the extending distances of the cracks in the bump 28 caused due to thermal shocks or other forces are able to be further increased, and the joint area between the UBM portion 29 and the bump 28 is able to be increased. Thus, thermal shock resistance is improved. Accordingly, damage to the bump due to thermal shocks or other forces is able to be reduced. Thus, the WLP acoustic wave device 2 having high thermal shock resistance is able to be provided.

Furthermore, since the via hole 19 and the UBM portion 29 preferably have the tapered shape, the area of the electrode pad 13 for a required size of the bump is able to be reduced. Accordingly, it is ensured that the area of the vibrator 12 between the plurality of electrode pads 13 is large. This improves freedom of design of the arrangement of, for example, the IDT electrode 11.

Although it is not illustrated in FIG. 5, as is the case with the relationship between the convex portion of the joint surface of the UBM portion 25 and the second cover layer illustrated in FIG. 4, it is preferable that the convex portion of the joint surface of the UBM portion 29 at which the UBM portion 29 is joined to the bump 28 project to a level below the level of the piezoelectric substrate 10 in an acoustic wave device according to a variation of the present preferred embodiment. With this structure, the joint surface is not restricted by the size of an opening of the via hole in a rear surface 10b of the piezoelectric substrate 10. Accordingly, the area of the joint surface is able to be increased. This enables the extending distances of the cracks caused in the bump along the joint interface to be further increased. That is, since the extending distances of the cracks are able to be determined in accordance with the size of the bump independently of the diameter of the via opening of the rear surface 10b, thermal shock resistance is improved. Accordingly, damage to the bump due to thermal shocks or other forces is able to be reduced. Thus, the acoustic wave device having high thermal shock resistance is able to be provided.

Third Preferred Embodiment

An acoustic wave device 3 according to a third preferred embodiment of the present invention preferably has a CSP structure, whereas the acoustic wave device according to the first preferred embodiment and the second preferred embodiment preferably has the WLP structure.

Figure 6:
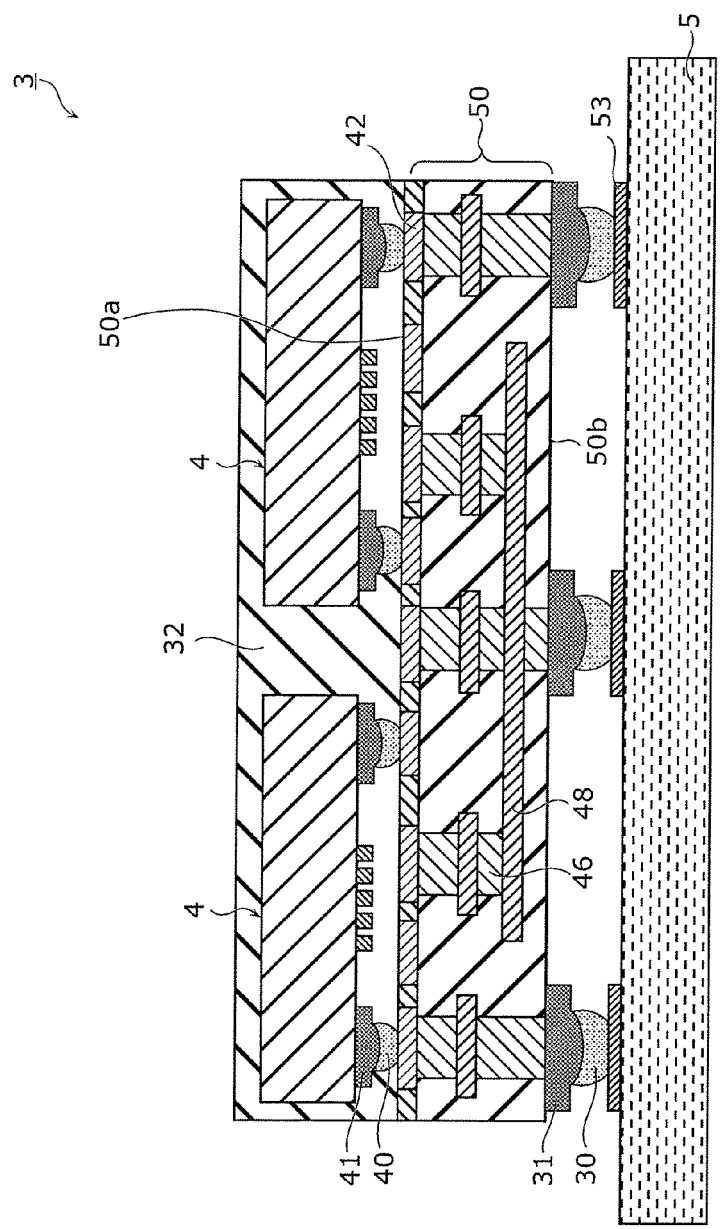
FIG. 6 is a sectional view of an acoustic wave device according to a third preferred embodiment of the present invention.
Figure 7:
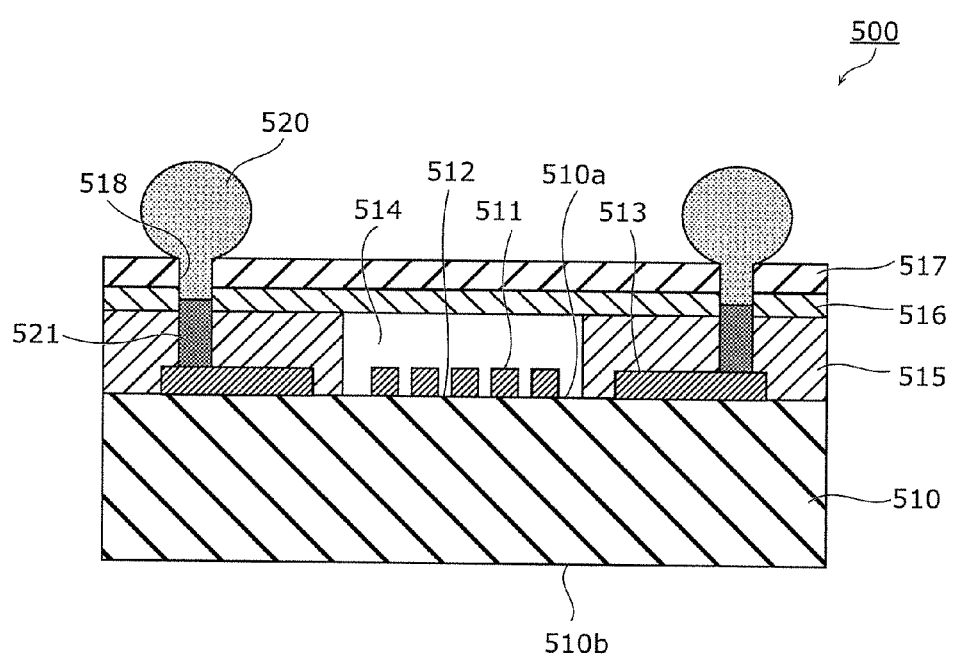
FIG. 7 is a sectional view of an acoustic wave device disclosed in International Publication No. 2009/104438.

FIG. 6 is a sectional view of the acoustic wave device 3 according to the third preferred embodiment. The acoustic wave device 3 illustrated in FIG. 6 includes acoustic wave elements 4, a mounting substrate 50, a sealing member 32, land electrodes 31, and bumps 30. FIG. 6 illustrates a configuration in which the acoustic wave device 3 is mounted on the external mounting board 5 by joining the bumps 30 and the land electrodes 53 included in the external mounting board 5 to one another. The acoustic wave device 3 according to the present preferred embodiment will be described below by focusing on different elements from those of the acoustic wave device 1 according to the first preferred embodiment and omitting description of the same elements as those of the acoustic wave device 1.

As illustrated in FIG. 6, two acoustic wave elements 4 are flip-chip mounted on a front surface 50a of the mounting substrate 50. Each of the two acoustic wave elements 4 is preferably, for example, a SAW filter in which, as is the case with the acoustic wave device 1 according to the first preferred embodiment, an IDT electrode and electrode pads 41 are provided on a piezoelectric substrate. More specifically, the two acoustic wave elements 4 are joined to land electrodes 42 of the mounting substrate 50 through the electrode pads 41 and bumps 40. The electrode pads 41 are provided on the front surface of the piezoelectric substrate and extract electric signals.

Here, a joint surface of each of the electrode pads 41 at which the electrode pad 41 is joined to a corresponding one of the bumps 40 may preferably have a curved shape that is convex towards the bump 40 side. With this structure, the extending directions of the cracks caused near the joint interface in the bump 40 are not horizontal. The cracks extend, for example, in directions along the joint interface or directions toward the center of the bump 40 starting from the joint interface at an outer periphery of the bump 40. This ensures long extending distances of the cracks as compared to the related-art acoustic wave device in which the joint interface is flat. Accordingly, damage to the bump due to thermal shocks or other forces is able to be reduced. Thus, the CSP acoustic wave device 3 having high thermal shock resistance is able to be provided.

The acoustic wave device 3 is preferably used for, for example, a SAW duplexer, a SAW dual filter, or other suitable device. When the acoustic wave device 3 is used for a SAW duplexer, one of the acoustic wave elements 4 is a transmitter SAW filter that selectively allows transmission signals of a specified frequency band width to pass therethrough, and the other acoustic wave element 4 is a receiver SAW filter that selectively allows reception signals of the frequency band width to pass therethrough. Furthermore, when the acoustic wave device 3 is used for a SAW dual filter, one of the acoustic wave elements 4 is a first receiver SAW filter that selectively allows reception signals of a specified frequency band width to pass therethrough, and the other acoustic wave element 4 is a second receiver SAW filter that selectively allows reception signals of a different frequency band width from the frequency band width allowed to pass through the first receiver SAW filter to pass therethrough.

The sealing member 32 is disposed so that, when the two acoustic wave elements 4 are flip-chip mounted on the mounting substrate 50, the sealing member 32 is in close contact with the mounting substrate 50 and the two acoustic wave elements 4. Here, a hollow space not filled with the sealing member 32 is reliably maintained in a region including the IDT electrodes. Preferred examples of the sealing member 32 include, for example, resin such as epoxy resin. The epoxy resin may preferably include thermosetting epoxy resin that includes inorganic filler, such as $SiO_2$, for example.

The land electrodes 31 to mount the acoustic wave device 3 on the external mounting board 5 are exposed on a rear surface 50b (main surface) side of the mounting substrate 50. The land electrodes 31 are provided on the mounting substrate 50 on which the piezoelectric substrate of the acoustic wave elements 4 are mounted. The land electrodes 31 extract electric signals from the IDT electrodes of the acoustic wave elements 4 or supply the electric signals to the IDT electrodes of the acoustic wave elements 4. Substrate via conductors 46 and an inner wiring pattern 48 are provided in the mounting substrate 50 so as to electrically connect the land electrodes 42 provided on the front surface 50a side and the land electrodes 31 provided on the rear surface 50b side to one another.

Here, a joint surface of each of the land electrodes 31 at which the land electrode 31 is joined to a corresponding one of the bumps 30 may preferably have a curved shape that is convex towards the bump 30 side. With this structure, the extending directions of the cracks caused near the joint interface in the bump 30 are not horizontal. The cracks extend, for example, in directions along the spherical surface or directions toward the center of the bump 30 starting from the joint interface at an outer periphery of the bump 30. This ensures long extending distances of the cracks as compared to the related-art acoustic wave device in which the joint interface is flat. Accordingly, damage to the bump due to thermal shocks or other forces is able to be reduced. Thus, the CSP acoustic wave device 3 having high thermal shock resistance is able to be provided.

In order to dispose the joint surface between each of the electrode pads 41 and a corresponding one of the bumps 40 and the joint surface between each of the land electrodes 31 and a corresponding one of the bumps 30 to have spherical shapes or substantially spherical shapes that are convex towards the bump side, the surfaces of the electrode pad 41 and the land electrode 31 are structured to have convex shapes in advance before the bump 40 and the bump 30 are provided. Examples of a technique to structure the above described shapes include, for example, a technique in which the surfaces of the electrode pad 41 and the land electrode 31 are etched and a technique in which, after flat metal layers have been formed, different metal bodies are added only to specified locations on the surfaces of the metal layers.

Furthermore, in the acoustic wave device 3 according to the present preferred embodiment, the acoustic wave elements 4 are not necessarily SAW filters. The acoustic wave elements 4 may be acoustic wave filters that include series resonators or parallel resonators and using boundary acoustic waves or BAWs (bulk acoustic waves).

Furthermore, the acoustic wave device 3 does not necessarily include two acoustic wave elements 4. The acoustic wave device 3 may include only a single acoustic wave element 4 or a functional element other than the acoustic wave element. For example, the acoustic wave device 3 may include, for example, a high-frequency filter element and a high-frequency amplifier element. Examples of a high-frequency filter element include, for example, an LC filter including an inductance element and a capacitor element in addition to the elastic filter. Furthermore, examples of a high-frequency amplifier element include a low noise amplifier (LNA) and a power amplifier (PA), and other elements.

Although acoustic wave devices according to the preferred embodiments of the present invention have been described by referring to the preferred embodiments and variations, the acoustic wave devices according to the present invention are not limited to the above-described preferred embodiments and/or variations. The present invention also includes different preferred embodiments obtained by combining any elements in the above-described preferred embodiments and variations, variations obtained by adding to the above-described preferred embodiments and variations a variety of modifications conceived by those skilled in the art without departing from the gist of the present invention, and a variety of devices that include therein the acoustic wave devices according to preferred embodiments and variations of the present disclosure.

The acoustic wave devices according to the first preferred embodiment and the second preferred embodiment are usable not only for SAW filters but also for acoustic wave filters that include series resonators or parallel resonators and using boundary acoustic waves or BAWs.

Acoustic wave devices according to preferred embodiments of the present invention that have high thermal shock resistance and that are small in size and height may be widely used for communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate;
a functional electrode provided on a front surface of the piezoelectric substrate;
an electrode pad provided on the front surface of the piezoelectric substrate;
a support provided on the front surface of the piezoelectric substrate and surrounding the functional electrode;
a cover provided on the support such that the cover, the support, and the piezoelectric substrate seal the functional electrode in a hollow space;
a via conductor joined to the electrode pad; and
a bump joined to the via conductor; wherein
a joint surface of the via conductor at which the via conductor is joined to the bump has a curved shape that is convex towards a bump side;
the via conductor penetrates through the piezoelectric substrate; and
the bump projects from a rear surface of the piezoelectric substrate.

2. The acoustic wave device according to claim 1, wherein the via conductor and the bump are made of different materials from each other.

3. The acoustic wave device according to claim 1, wherein a convex portion of the joint surface of the via conductor at which the via conductor is joined to the bump projects to a level below a level of the piezoelectric substrate.

4. The acoustic wave device according to claim 1, wherein a sectional area of the via conductor in a plane direction of the piezoelectric substrate increases from a joint surface at which the via conductor is joined to the electrode pad towards the joint surface at which the via conductor is joined to the bump except for a convex portion of the joint surface at which the via conductor is joined to the bump.

5. The acoustic wave device according to claim 1, wherein the functional electrode is an IDT electrode that converts elastic waves propagating through the piezoelectric substrate into electric signals or converts the electric signals into the elastic waves.

6. The acoustic wave device according to claim 1, wherein the piezoelectric substrate is made of a $LiNbO_3$ single crystal or a $LiTaO_3$ single crystal.

7. The acoustic wave device according to claim 1, wherein the functional electrode is made of Cu, Al, Pt, a multilayer body of Cu, Al, or Pt, or an alloy of Cu, Al, or Pt.

8. The acoustic wave device according to claim 1, wherein the cover includes a first cover layer provided on the support, and a second cover layer provided on the first cover layer.

9. The acoustic wave device according to claim 8, wherein the first cover layer is made of a material that includes at least one of epoxy, urethane, phenol, polyester, BCB, and PBO.

10. The acoustic wave device according to claim 8, wherein the second cover layer is made of a material that includes at least one of polyimide, epoxy, BCB, PBO, silicon, silicon oxide, $LiTaO_3$ and $LiNbO_3$.

11. The acoustic wave device according to claim 1, wherein the support is made of a material that includes at least one of polyimide, epoxy, benzocyclobutene (BCB), polybenzoxazole (PBO), metal, and silicon oxide.

12. The acoustic wave device according to claim 2, wherein
the material of the via conductor is Cu/Ni alloy or Ni/Au alloy; and
the material of the bump is Sn/Ag/Cu or a material primarily including Au.

13. The acoustic wave device according to claim 1, wherein the joint surface of the via conductor at which the via conductor is joined to the bump has a spherical shape or substantially spherical shape that is convex towards the bump side.

14. An acoustic wave device comprising:
a piezoelectric substrate;
a functional electrode provided on a front surface of the piezoelectric substrate and that converts an elastic wave propagating through the piezoelectric substrate into an electric signal or converts an electric signal into the elastic wave;
a mounting substrate on which the piezoelectric substrate is mounted;
an electrode provided on the front surface of the piezoelectric substrate or a main surface of the mounting substrate and that extracts the electric signal from the functional electrode or supplies an electric signal to the functional electrode;
a bump joined to the electrode; and
a sealing member that seals the piezoelectric substrate to the mounting substrate; wherein
a joint surface of the electrode at which the electrode is joined to the bump has a curved shape that is convex towards a bump side.

15. The acoustic wave device according to claim 14, wherein the piezoelectric substrate is made of a $LiNbO_3$ single crystal or a $LiTaO_3$ single crystal.

16. The acoustic wave device according to claim 14, wherein the functional electrode is made of Cu, Al, Pt, a multilayer body of Cu, Al, or Pt, or an alloy of Cu, Al, or Pt.

17. The acoustic wave device according to claim 14, wherein the joint surface of the electrode at which the electrode is joined to the bump has a spherical shape or substantially spherical shape that is convex towards the bump side.

* * * * *